(12) United States Patent
Li et al.

(10) Patent No.: US 7,994,856 B2
(45) Date of Patent: Aug. 9, 2011

(54) PREDISTORTER, PREDISTORTION METHOD, AND PREDISTORTION SYSTEM

(75) Inventors: Hui Li, Beijing (CN); Zhan Shi, Beijing (CN); JianMin Zhou, Beijing (CN)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/774,960

(22) Filed: May 6, 2010

(65) Prior Publication Data
US 2010/0289572 A1     Nov. 18, 2010

(30) Foreign Application Priority Data

May 18, 2009  (CN) .......................... 2009 1 0141284

(51) Int. Cl.
*H03F 1/26*    (2006.01)

(52) U.S. Cl. ........................................ 330/149; 375/297
(58) Field of Classification Search .................. 330/149
See application file for complete search history.

(56) References Cited

U.S. PATENT DOCUMENTS

| | | | |
|---|---|---|---|
| 7,023,273 B2 * | 4/2006 | Johnson et al. | 330/149 |
| 7,149,257 B2 * | 12/2006 | Braithwaite | 375/296 |
| 7,414,470 B2 * | 8/2008 | Okazaki | 330/149 |

* cited by examiner

*Primary Examiner* — Henry K Choe
(74) *Attorney, Agent, or Firm* — Katten Muchin Rosenman LLP

(57) ABSTRACT

This invention relates to a predistorter, a predistortion method, and a predistortion system. The predistorter comprises a modulus value determining section, for determining a modulus value of an input signal; a base searching section, for searching a predetermined base lookup table in accordance with the modulus value of the input signal, so as to obtain a base lookup table value; an offset searching section, for searching a predetermined offset lookup table in accordance with the modulus value of the input signal, so as to obtain an offset lookup table value; an interpolation factor generating section, for generating an interpolation factor in accordance with the modulus value of the input signal; a multiplying section, for multiplying the offset lookup table value with the interpolation factor; and a summating section, for adding a product obtained by the multiplying section to the base lookup table value, so as to obtain a predistortion value.

10 Claims, 6 Drawing Sheets

PREDISTORTER, PREDISTORTION METHOD, AND PREDISTORTION SYSTEM

FIELD OF THE INVENTION

The present invention relates to power amplifiers, and more particularly, to nonlinear correction of a power amplifier.

BACKGROUND OF THE INVENTION

With the development of communication systems, various modulation modes with high spectral efficiency have found wide applications. Modulation signals of these modulation modes have inconstant envelopes, thus putting very high demand on the linearity of the power amplifier inside the transmitter. As a result, the linearization method of power amplification becomes an indispensable technique. Due to its simplicity, flexibility and low cost for implementation, digital baseband predistortion has become an efficient linearization method for power amplification.

The predistortion method using scalar information (such as the out-band power and the ratio between the in-band and out-band powers of a power amplified output signal) as the optimizing target can avoid the influence of factors such as delay of the feedback loop and I/O imbalance etc., whereby the process is further simplified and made more effective.

FIG. 1 is a block diagram illustrating the principle of a conventional predistortion method. As shown in FIG. 1, after baseband information source information from an information source 101 passes through a lookup table predistorter 102, an amplitude predistortion value and a phase predistortion value are obtained; a multiplier 103 multiplies the baseband information source information with the predistortion values to obtain a predistorted signal, and this signal is converted by a digital-to-analog converter 104 into an analog signal. After the analog signal is up-converted by an up-converter 105 into an RF signal, it is input to a power amplifier (also referred to as PA) 106. The signal amplified by the power amplifier 106 is transmitted via an antenna. Meanwhile, a part of the signal output from power amplification is down-converted by a down-converter 107 and then fed back to an analog-to-digital converter 108, by which the signal is sampled to obtain a feedback digital baseband signal output from power amplification. The baseband signal is analyzed in an out-band power calculating module 109 using the digital signal processing technology to thereby obtain an out-band power value of the digital baseband signal. Subsequently in a module 110, the out-band power value serves as a target function to optimize parameters of the lookup table predistorter 102, and the parameters of the predistorter are updated using an optimization algorithm to realize the adaptive predistortion process.

One of the essential problems in such algorithms is which kind of structure and algorithm should be used to realize the lookup table predistorter as well as the update of the predistortion parameters used therein.

In certain conventional technologies, a set of predistortion parameters is calculated by measuring power amplification characteristics under various environment conditions, is subsequently stored in a predistorter, and the corresponding predistortion parameter is selected in accordance with the current operating status. However, these methods are inferior in flexibility, and require larger storage capacity and testing operations. The U.S. Pat. No. 6,731,168 prestores two lookup tables, one under high temperature condition and the other under low temperature condition. Interpolation factors are adaptively controlled in accordance with temperature information as fed back, and interpolation is performed between the two lookup tables to obtain the current predistortion table. This method enables the parameters of the predistorter to lie within the range of [0, 1], and this greatly facilitates hardware implementation. Moreover, the predistortion table in the adaptive updating process is always restricted between the high temperature lookup table and the low temperature lookup table, where there is no divergence phenomenon, and the performance is stable. However, this method requires a power amplification heat model to generate interpolation factors, and such a heat model is difficult to obtain in practice. Moreover, under the same power amplification temperature, interpolation factors at each of the lookup table index values are identical, and the predistortion table obtained through interpolation is relatively less in degree of freedom and inferior in flexibility.

BRIEF SUMMARY OF THE INVENTION

The present invention is proposed in view of the problems inherent in the prior art to solve the defects existent in the conventional art and to provide at least one advantageous choice.

To achieve the aforementioned objectives, the present application provides the following aspects.

Aspect 1—a predistorter, which comprises a modulus value determining section, for determining a modulus value of an input signal; a base searching section, for searching a predetermined base lookup table in accordance with the modulus value of the input signal, so as to obtain a base lookup table value; an offset searching section, for searching a predetermined offset lookup table in accordance with the modulus value of the input signal, so as to obtain an offset lookup table value; an interpolation factor generating section, for generating an interpolation factor in accordance with the modulus value of the input signal; a multiplying section, for multiplying the offset lookup table value with the interpolation factor; and a summating section, for adding a product obtained by the multiplying section to the base lookup table value, so as to obtain a predistortion value.

Aspect 2—the predistorter according to Aspect 1, the base lookup table is a base amplitude lookup table, the base lookup table value is a base amplitude lookup table value, the offset lookup table is an offset amplitude lookup table, the offset lookup table value is an offset amplitude lookup table value, the interpolation factor is an amplitude interpolation factor, and the predistortion value is an amplitude predistortion value.

Aspect 3—the predistorter according to Aspect 1, the base lookup table is a base phase lookup table, the base lookup table value is a base phase lookup table value, the offset lookup table is an offset phase lookup table, the offset lookup table value is an offset phase lookup table value, the interpolation factor is a phase interpolation factor, and the predistortion value is a phase predistortion value.

Aspect 4—the predistorter according to Aspect 1, the base lookup table includes a base phase lookup table and a base amplitude lookup table, the base lookup table value includes a base phase lookup table value and a base amplitude lookup table value, the offset lookup table includes an offset phase lookup table and an offset amplitude lookup table, the offset lookup table value includes an offset phase lookup table value and an offset amplitude lookup table value, the interpolation factor includes a phase interpolation factor and an amplitude interpolation factor, the multiplying section multiplies the offset phase lookup table value with the phase interpolation factor, and multiplies the offset amplitude lookup table value with the amplitude interpolation factor, and the summating section adds the product of the offset phase lookup table value and the phase interpolation factor obtained by the multiplying section to the base phase lookup table value to obtain a phase predistortion value, and adds the product of the offset amplitude lookup table value and the amplitude interpolation factor obtained by the multiplying section to the base amplitude lookup table value to obtain an amplitude predistortion value.

Aspect 5—the predistorter according to Aspect 1, the interpolation factor generating section comprises a lookup table index value obtaining section, for obtaining a lookup table index value; a predistortion parameter storing section, for storing an essential interpolation factor and an essential lookup table index value corresponding thereto; and an interpolation factor obtaining section, for obtaining an interpolation factor value in accordance with the lookup table index value, the essential lookup table index value and the essential interpolation factor.

Aspect 6—the predistorter according to Aspect 5, the interpolation factor obtaining section makes use of piecewise linear interpolation or lagrange interpolation to obtain the interpolation factor value in accordance with the lookup table index value, the essential lookup table index value and the essential interpolation factor.

Aspect 7—the predistorter according to Aspect 5 or 6, the essential lookup table index value and the essential interpolation factor are parameters of the predistorter.

Aspect 8—a predistortion system that comprises the predistorter according to any one of Aspects 1 to 7.

Aspect 9—the predistortion system according to Aspect 8, further comprising a power amplifier, an out-band power calculating unit, and a predistorter parameter updating unit, wherein the power amplifier amplifies a signal predistorted by the predistorter, the out-band power calculating unit determines an out-band power of the amplified signal fed back from the power amplifier, and the predistorter parameter updating unit updates a parameter of the predistorter in accordance with the out-band power.

Aspect 10—a predistortion method, which comprises determining a modulus value of an input signal; searching a predetermined base lookup table in accordance with the modulus value of the input signal, so as to obtain a base lookup table value; searching a predetermined offset lookup table in accordance with the modulus value of the input signal, so as to obtain an offset lookup table value; generating an interpolation factor in accordance with the modulus value of the input signal; multiplying the offset lookup table value with the interpolation factor; and adding a product obtained by the multiplying to the base lookup table value, so as to obtain a predistortion value.

The digital baseband predistortion apparatus and method according to the embodiments of the present invention perform out-band power detection on a power amplified output signal which is fed back, and use the scalar information to carry out adaptive update of the predistorter. The predistorter performs amplitude and phase predistortions on an input information source signal to generate a predistorted signal to be input to power amplification. The predistorter tests the power amplification offline under two extreme conditions, calculates to obtain a base amplitude phase lookup table and an offset amplitude phase lookup table, obtains lookup table index values according to the modulus value of the input signal, and obtains an interpolation factor value at each lookup table index value by interpolating interpolation factors at essential lookup table index values. Thus, there can be different interpolation factor values that correspond to different lookup table index values. The parameters of the lookup table predistorter are precisely the aforementioned essential lookup table index values and their corresponding interpolation factor values. During the process of adaptive update, the out-band power of the power amplified output signal is reduced by updating these parameter values of the predistorter. Contrary to conventional methods, no calculation of power amplification heat model and power amplification temperature is required by the predistorter and the predistortion method according to the embodiments of the present invention, and flexible interpolation in two lookup tables can be more effectively achieved.

BRIEF DESCRIPTION OF THE DRAWINGS

To make clearer the embodiments of the present invention or technical solutions of the conventional solution, accompanying drawings necessary for use in explaining the embodiments or the conventional technologies are briefly presented below. Apparently, the drawings described below are merely directed to certain embodiments of the present invention, while it is possible for and requires no creative effort from a person ordinarily skilled in the art to obtain other drawings based on these drawings.

DETAILED DESCRIPTION OF THE INVENTION

Figure 1:
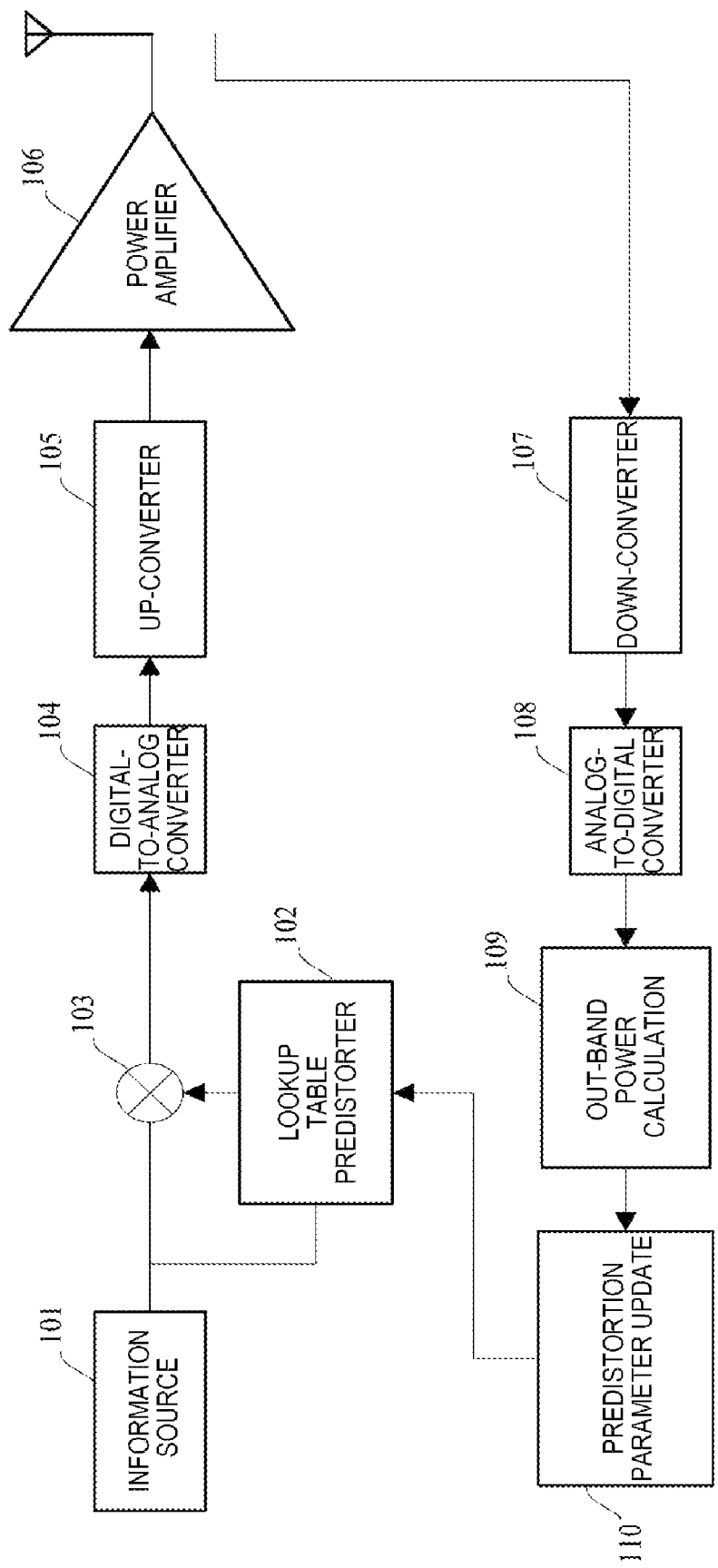
FIG. 1 is a block diagram illustrating the principle of a power amplification apparatus employing the conventional method.

Embodiments of the present invention are described in greater detail below with reference to the accompanying drawings. To make the description of the present invention clear and concise, this paper omits description of those well known component parts that might engender unclarity to the present invention. Moreover, identical or similar component parts are indicated by the same reference numerals, and repetitive explanation thereof is omitted.

Firstly, a predistorter capable of replacing the lookup table predistorter 102 as shown in FIG. 1 is provided in the embodiments of the present invention.

Figure 2:
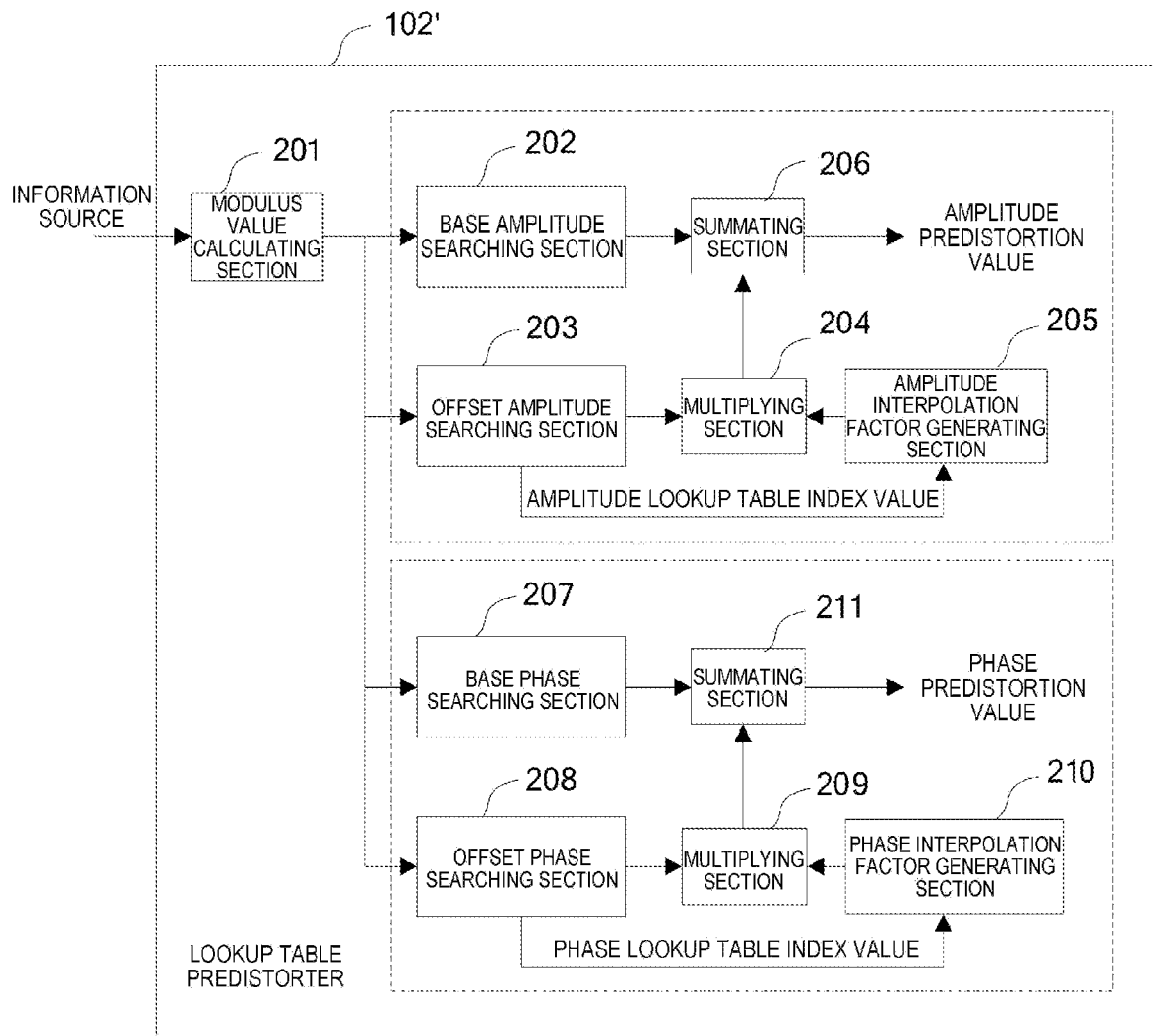
FIG. 2 is a block diagram exemplarily illustrating the structure of a predistorter according to one embodiment of the present invention.

FIG. 2 is a block diagram exemplarily illustrating the structure of a predistorter according to one embodiment of the present invention. As shown in FIG. 2, the predistorter 102' according to one embodiment of the present invention comprises a modulus value calculating section 201, an amplitude predistortion part consisting of a base amplitude searching section 202, an offset amplitude searching section 203, an amplitude interpolation factor generating section 205, a multiplying section 204 and a summating section 206, and a phase predistortion part consisting of a base phase searching section 207, an offset phase searching section 208, a phase interpolation factor generating section 210, a multiplying section 209 and a summating section 211. Since the amplitude predistortion part and the phase predistortion part are identical in structure, the amplitude predistortion part is taken as an example below to make explanation. Offline operation is firstly performed, whereby power amplification characteristics are tested under two extreme circumstances (such as the highest and lowest possible temperatures under which the power amplification may operate, before and after aging of power amplification, etc.) and reverse solution is performed to obtain amplitude predistortion lookup tables under two extreme circumstances. Many classical methods can be employed in the process to generate predistortion lookup tables by inverse solution of the power amplification characteristics. A simple method is to directly exchange input/output relationships of the tested power amplification characteristics, as recited in Document [1] ([1] K. J. Muhonen, M. Kavehrad and R. Krishnamoorthy. Look-up table techniques for adaptive digital predistortion: a development and comparison. IEEE Trans. on Vehicular Technology, Vol. 49, No. 5, September 2000. pp 1995-2002). One amplitude predistortion lookup table is selected therefrom to serve as a base amplitude lookup table, and an offset table formed from differences between the other amplitude predistortion lookup table and the base amplitude predistortion lookup table serves as an offset amplitude lookup table. The offline operation is completed by now. During online operation, the modulus value calculating section 201 calculates the modulus of an information source signal input from an information source 101, namely the amplitude value of an input complex signal. Based on the modulus value of the input information source signal as calculated by the modulus value calculating section 201, the base amplitude searching section 202 and the offset amplitude searching section 203 search for outputs, which correspond to the modulus value, of the base amplitude lookup table and the offset amplitude lookup table, to obtain a base amplitude lookup table value and an offset amplitude lookup table value. The offset amplitude searching section 203 further obtains an amplitude lookup table index value k.

The base amplitude lookup table and the offset amplitude lookup table are tested offline and calculated to be obtained according to the previously mentioned method. The two lookup tables have the same capacity, and lengths of the lookup tables are defined as L here, so that valuation range of the amplitude lookup table index value (expressed as k) is from 1 to L.

The structure of the base amplitude lookup table can for instance be illustrated by the following Table.

| Amplitude Value Intervals in which the Amplitude Value of Input Signal Rests | Lookup Table Values |
| --- | --- |
| Amplitude Value Interval 1 | Lookup Table Value 1 |
| Amplitude Value Interval 2 | Lookup Table Value 2 |
| ... | ... |
| Amplitude Value Interval L | Lookup Table Value L |

The structure of the offset amplitude lookup table can for instance be illustrated by the following Table.

| Amplitude Value Intervals in which the Amplitude Value of Input Signal Rests | Lookup Table Values | Amplitude Lookup Table Indices |
| --- | --- | --- |
| Amplitude Value Interval 1 | Lookup Table Value 1 | 1 |
| Amplitude Value Interval 2 | Lookup Table Value 2 | 2 |
| ... | ... | ... |
| Amplitude Value Interval L | Lookup Table Value L | L |

As should be noted, although in the above description the amplitude lookup table index is taken as a field and set in the offset amplitude lookup table, and the offset amplitude searching section 203 serves as an amplitude lookup table index value obtaining unit, it is also possible to set the amplitude lookup table index in the base amplitude lookup table. Alternatively, the amplitude lookup table index can be set in a separate table together with the amplitude value of the input signal.

When the amplitude lookup table index is taken as a field and set in the base amplitude lookup table, it is possible for the base amplitude searching section 202 to transfer the amplitude lookup table index to the amplitude interpolation factor generating section 205, in which case the base amplitude searching section 202 serves as the amplitude lookup table index value obtaining unit according to the embodiments of the present invention.

When the amplitude lookup table index is taken as a field and set in a separate table together with the amplitude value of the input signal, a separate amplitude lookup table index value obtaining unit can be used to transfer the amplitude lookup table index to the amplitude interpolation factor generating section 205.

Moreover, it is also possible for the amplitude interpolation factor generating section 205, based on the modulus value of the input information source signal as calculated by the modulus value calculating section 201, to obtain the amplitude lookup table index and calculate the corresponding amplitude interpolation factor. In short, the amplitude lookup table index value obtaining unit can be relatively flexible in position, and can be regarded as part of the amplitude interpolation factor generating section 205 no matter where it locates.

The amplitude interpolation factor generating section 205 calculates the corresponding amplitude interpolation factor based on the amplitude lookup table index value. The amplitude interpolation factor generating section 205 in FIG. 2 is described in further detail below with reference to FIG. 3.

Figure 3:
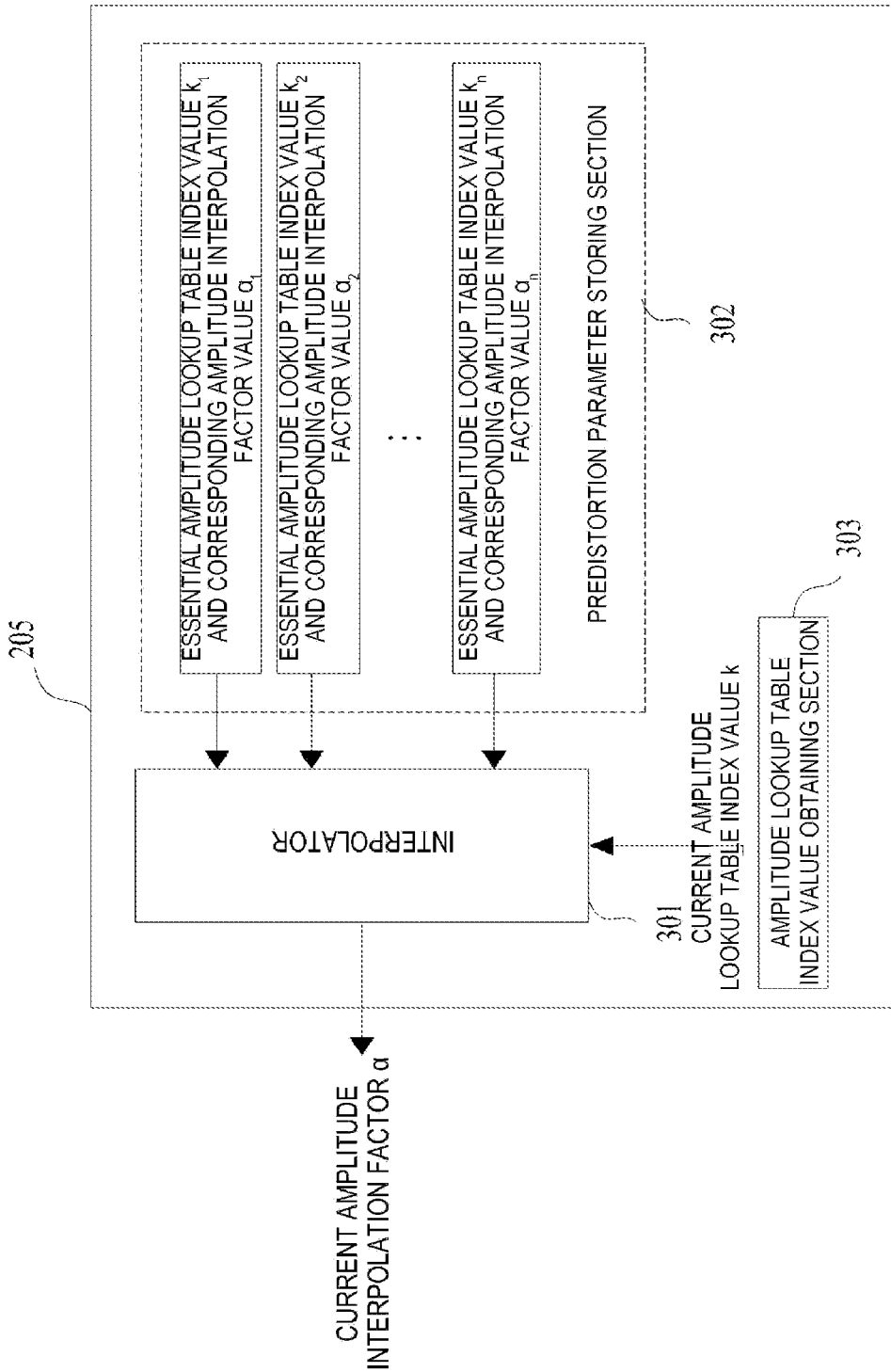
FIG. 3 is a view explaining in detail the interpolation factor generating section in FIG. 2.

As shown in FIG. 3, the amplitude interpolation factor generating section 205 according to one embodiment of the present invention includes an amplitude lookup table index value obtaining unit 303, which, as previously mentioned, can be embodied either as the offset amplitude searching section 203 or as the base amplitude searching section 202. The amplitude interpolation factor generating section 205 further includes a predistortion parameter storing section 302 and an interpolator 301. The predistortion parameter storing section 302 stores the essential amplitude lookup table index value and the essential amplitude interpolation factor. The interpolator 301 is an interpolation factor obtaining section that obtains the interpolation factor value in accordance with the lookup table index value, the essential lookup table index value, and the essential interpolation factor.

In the embodiments of the present invention, different interpolation factors are used to correspond to different lookup table index values. The interpolation factors are obtained by the method of interpolation. Generation of amplitude interpolation factors is explained in detail below. N essential amplitude lookup table index values are selected in advance to be respectively expressed as $k_1, k_2, \ldots, k_n$, and corresponding essential amplitude interpolation factors are respectively expressed as $\alpha_1, \alpha_2, \ldots, \alpha_n$. These parameters serve as amplitude predistortion parameters of the lookup table predistorter 102. These essential amplitude lookup table index values and essential amplitude interpolation factors can be stored in correlation in the predistortion parameter storing section 302. The predistortion parameter storing section can be a register, or any other storing means capable of rewriting data stored thereon.

The interpolator 301 performs interpolation calculation, and carries out interpolation of the essential amplitude interpolation factors $\alpha_1, \alpha_2, \ldots, \alpha_n$ in accordance with the current amplitude lookup table index value k to calculate the current amplitude interpolation factor value $\alpha$. Interpolation algorithms usable by the interpolator 301 include many methods such as piecewise linear interpolation and Lagrange interpolation etc. The piecewise linear interpolation method is taken as an example below to explain generation of the amplitude interpolation factor value.

If the current amplitude lookup table index value k satisfies $k_i \leq k < k_{i+1}$, i=1, 2, ... n−1, the corresponding current amplitude interpolation factor value $\alpha$ will be calculated as follows:

$$\alpha = \alpha_i + (k - k_i) \cdot \frac{(\alpha_{i+1} - \alpha_i)}{(k_{i+1} - k_i)} \quad (1)$$

Referring back to FIG. 2, the multiplying section 204 multiplies the offset amplitude lookup table value with the amplitude interpolation factor, so as to obtain a weighted offset amplitude lookup table value. The summating section 206 adds the base amplitude lookup table value to the weighted offset amplitude lookup table value, so as to obtain an amplitude predistortion value.

Generation of the phase predistortion value is substantially the same as the aforementioned process. With reference to the accompanying drawings and the above description, a person skilled in the art would know how to obtain the phase predistortion value, so that this is not repetitively described here. Moreover, although FIG. 2 simultaneously illustrates the amplitude predistortion part according to the present invention and the phase predistortion part according to the present invention, it should be aware to persons skilled in the art that it is possible for only one of the amplitude predistortion part and the phase predistortion part to employ the technical solution according to the embodiment of the present invention.

Figure 4:
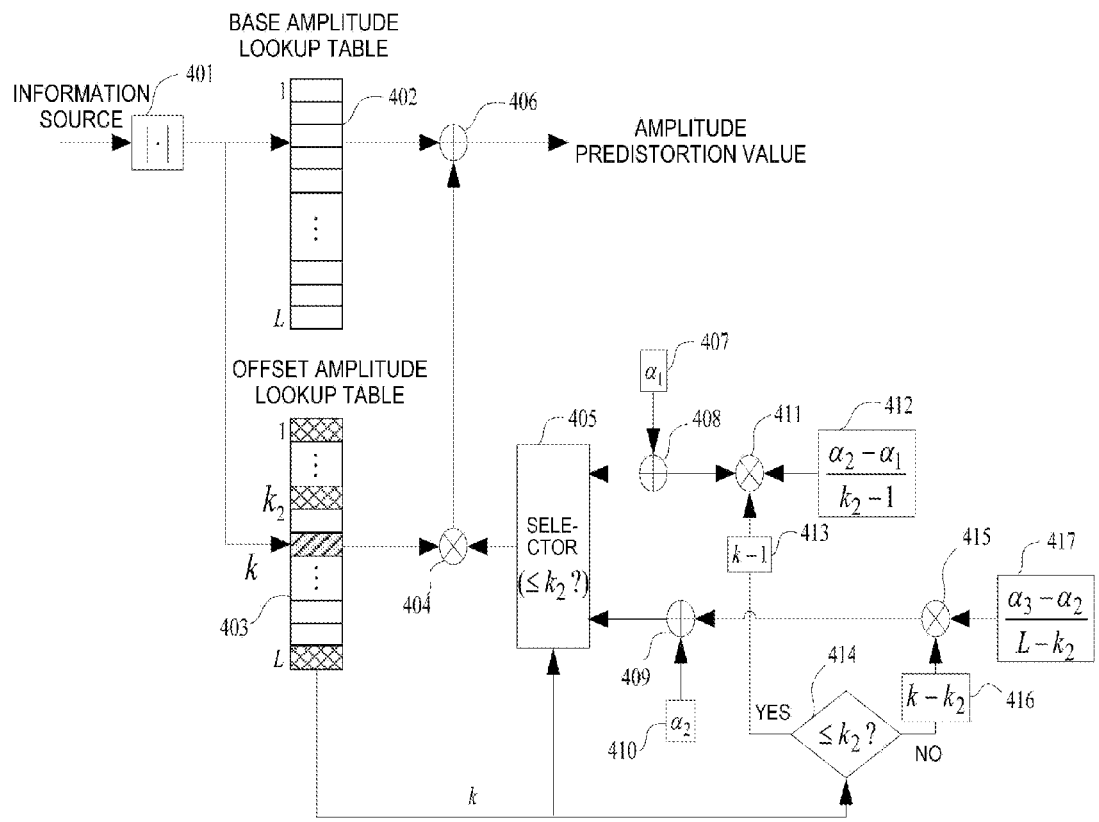
FIG. 4 illustrates a specific embodiment of the present invention.

FIG. 4 shows a specific embodiment of the amplitude prediction part as shown in FIG. 2. As shown in FIG. 4, the base amplitude lookup table 402 and the offset amplitude lookup table 403 are obtained by being tested offline and calculated by the previously mentioned method. The two lookup tables have the same capacity, and lengths of the lookup tables are defined as L here, so that the range of the amplitude lookup table index value (expressed as k) is from 1 to L (already marked up in FIG. 4). The information source signal input from the information source 101 firstly enters a modulus calculating section 401 for calculation of modulus, to obtain the modulus value of the input signal. The modulus calculating section 401 corresponds to the modulus value calculating section 201 in FIG. 2. Thereafter, the base amplitude searching section 202 and the offset amplitude searching section 203 search in the base amplitude lookup table 402 and the offset amplitude lookup table 403, to obtain the amplitude lookup table index value k, the base amplitude lookup table value and the offset amplitude lookup table value, which correspond to the modulus value of the input signal. Corresponding to the multiplying section 204 in FIG. 2, the multiplying section 404 multiplies the obtained offset amplitude lookup table value with an amplitude interpolation factor at the corresponding amplitude lookup table index value, to obtain a weighted offset amplitude lookup table value. Corresponding to the summating section 206 in FIG. 2, the adder 406 adds the obtained base amplitude lookup table value to the weighted offset amplitude lookup table value, to obtain an amplitude predistortion value. The remaining part in FIG. 4 corresponds to the amplitude interpolation factor generating section 205 (specifically, the interpolator 301) in FIG. 2. As specific implementation of the amplitude interpolation factor generating section 205 in FIG. 3, lookup table amplitude predistortion parameters are selected as follows, as shown in FIG. 4: three essential amplitude lookup table index values are selected, which are expressed as 1, $k_2$ and L (already marked up in the offset amplitude lookup table 403 in FIG. 4), and the corresponding amplitude interpolation factors are respectively $\alpha_1$, $\alpha_2$ and $\alpha_3$; in FIG. 4, the interpolator 301 employs the piecewise linear interpolation method. Thus, the essential amplitude lookup table index value $k_2$ divides the amplitude interpolation factor into two pieces (segments); when the range of the current amplitude lookup table index value k is $1 \leq k \leq k_2$ (corresponding to the branch where the multiplier 411 in FIG. 4 locates), the current amplitude interpolation factor is calculated as follows:

$$\alpha = \alpha_1 + (k - 1) \cdot \frac{\alpha_2 - \alpha_1}{k_2 - 1} \quad (2)$$

When the range of the current amplitude lookup table index value k is $k_2+1 \leq k \leq L$ (corresponding to the branch where the multiplier 415 in FIG. 4 locates), the current amplitude interpolation factor is calculated as follows:

$$\alpha = \alpha_2 + (k - k_2) \cdot \frac{\alpha_3 - \alpha_2}{L - k_2} \quad (3)$$

Accordingly, under the circumstance the parameters $\alpha_1$, $\alpha_2$, $\alpha_3$ and the essential amplitude lookup table index value $k_2$ are determined, the amplitude interpolation factor at a random amplitude lookup table index value can be calculated.

During online operation, at the same time of searching the base amplitude lookup table and the offset amplitude lookup table, the corresponding current amplitude lookup table index value k is transferred to a selector 405 and a decider 414. The decider decides, from the branch in which the multiplier 411 locates and the branch in which the multiplier 415 locates, which branch should be used to perform calculation of the current amplitude interpolation factor, in accordance with the relationship between the current index value k and the essential amplitude lookup table index value $k_2$, and the selector 405 outputs the calculation result of the corresponding branch to the multiplier 404.

For instance, in the case k>k2 as shown in FIG. 4, the decider 414 decides that the branch in which the multiplier 415 locates should be used to calculate the current amplitude interpolation factor. Meanwhile, the selector 405 outputs the calculation result of the corresponding branch to the multiplier 404.

The amplitude predistortion part is explained above. Both the structure and the operational process of the phase predistortion part are identical therewith. Consequently, the lookup table predistorter has altogether 8 updatable parameters, namely the 4 parameters of the amplitude predistortion part: $\alpha_1$, $\alpha_2$, $\alpha_3$ and the essential amplitude lookup table index value $k_2$, and the 4 parameters of the corresponding phase predistortion part.

As should be noted, the amplitude predistortion part in FIG. 4 is merely exemplary in nature, as it is possible for persons skilled in the art to conceive of various different technical solutions for performing interpolation calculation based on the embodiments of the present invention. For instance, there might be more essential amplitude lookup table index values, and the Lagrange interpolation method might as well be employed. Additionally, the specific circuit for implementation of the amplitude interpolation factor generating section 205 is not restricted to the one shown in FIG. 4, as various circuits conceivable to persons skilled in the art for use in interpolation calculation can also be employed. The division of generation of the interpolation factor into plural pieces and interpolation thereof can achieve higher predistortion flexibility.

Figure 5:
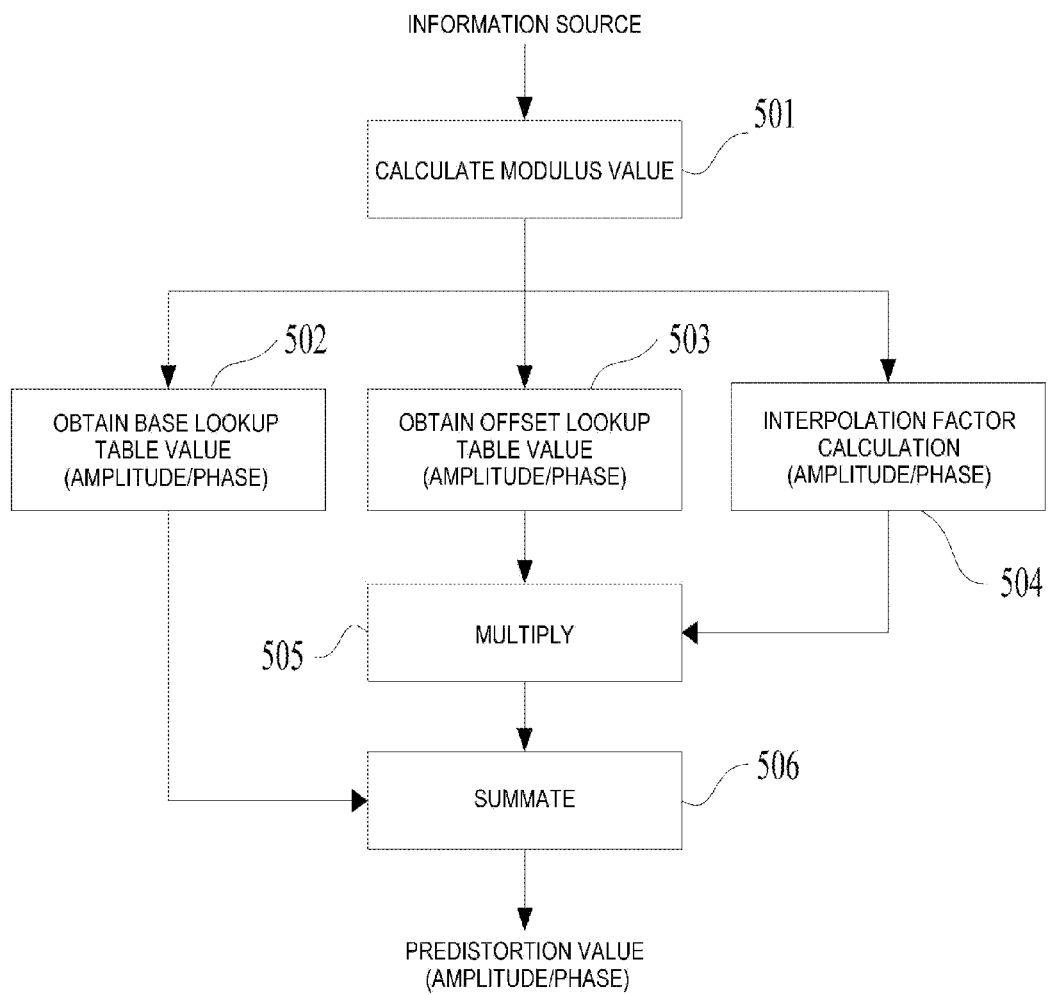
FIG. 5 is a flowchart illustrating a predistortion processing method according to one embodiment of the present invention.

FIG. 5 is a flowchart illustrating a predistortion processing method according to one embodiment of the present invention. Since amplitude and phase predistortions are simultaneously performed and the flows of the two are identical, these processes are shown together in FIG. 5. As shown in FIG. 5, the modulus value of the input information source signal is firstly calculated in Step 501. Subsequently in Step 502, the base lookup table is searched to obtain the base lookup table value, simultaneously in Step 503 the offset lookup table value is obtained, and calculation of the interpolation factor is completed in Step 504. Thereafter in Step 505, the offset lookup table value is multiplied with the interpolation factor. Finally in Step 506, the multiplying result obtained in Step 505 is added to the base lookup table value, to thereby obtain the predistortion value.

Figure 6:
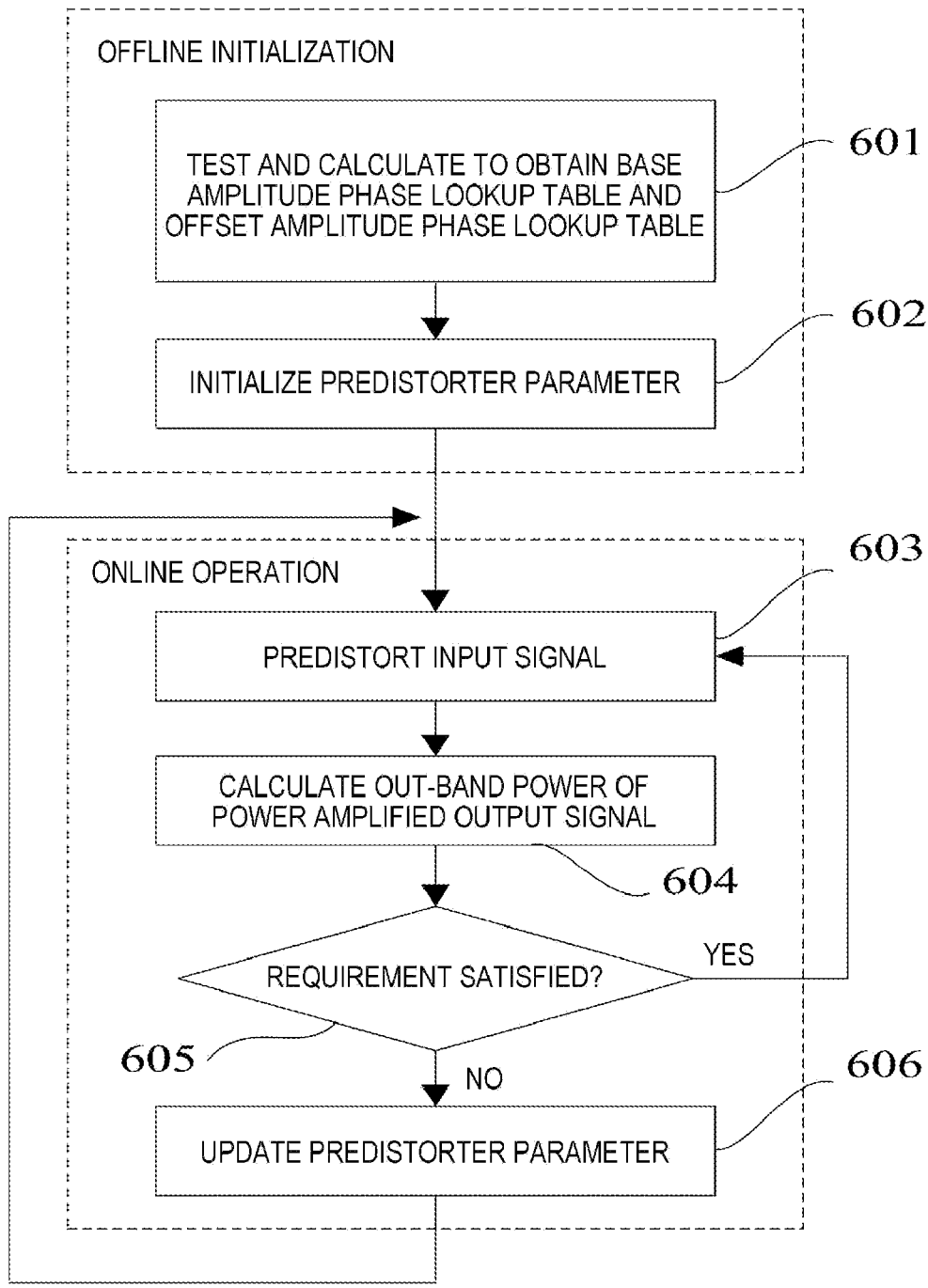
FIG. 6 is a flowchart illustrating the operation of a predistortion system according to the present invention.

FIG. 6 illustrates the operational flow of a predistortion system according to the present invention. The flow can be divided into two stages, namely an offline operation stage and an online operation stage. In the offline operation stage, the base amplitude phase lookup table and the offset amplitude phase lookup table are firstly obtained in Step 601 by testing and reserve solution calculation. The predistortion parameters are then initialized in Step 602. On completion of the offline operation, the process goes to the online operation stage. In Step 603 under initialization of the predistortion parameters, the input signal is predistorted as shown in FIG. 5. An output signal of the power amplifier 106 is fed back via the down-converter 107 to the analog-to-digital converter 108. Subsequently in Step 604, an out-band power of the signal output from the analog-to-digital converter 108 is calculated. In Step 605, the out-band power is compared with a threshold value, to determine whether the requirement is satisfied—if the requirement is satisfied, the process returns to Step 603 to continue to perform predistortion calculation on the signal under the current predistortion parameters. On the other hand, if it is determined in Step 605 that the requirement is not satisfied, the predistortion parameters are updated in Step 606. Update of the parameters can be carried out by classical adaptive algorithms such as the coordinate alternation method, or the pattern search method. During the process of update, amplitude predistortion parameters and phase predistortion parameters are alternately updated until the optimal predistortion parameter is obtained.

Moreover, the optimized target is not limited to the out-band power of the power amplified output signal, since functions such as the ratio between in-band signal power and out-band signal power can also be used.

Furthermore, although the above explanation is made taking the transmitter in a communication system for example, embodiments of the present invention are also applicable to any power-amplifier-related circuits that should be performed with signal predistortion.

As should be aware to those ordinarily skilled in the art, various units and method steps exemplarily described with reference to the embodiments disclosed in this paper can be implemented by hardware, software, or combination of hardware with software. Whether the functions should be executed by hardware or software is decided by particular applications of the technical solution and restrictive conditions of the design. A person skilled in the art may use different methods with regard to each of the particular applications to realize the described functions, and such realization shall not be considered to go beyond the scope of the present invention.

Steps of the methods or algorithms described with reference to the embodiments disclosed in this paper can be implemented by software executed by hardware (logical devices such as computer). When executed, the software enables the hardware (logical devices such as computer) to realize the aforementioned methods or their composing steps, or enables the hardware (logical devices such as computer) to serve as the aforementioned devices of the present invention.

The software may be built in a random access memory (RAM), a main memory, a read-only memory (ROM), an electrically programmable ROM, an electrically erasable programmable ROM, a register, a hard disk, a mobile magnetic disk, a CD-ROM, or any other storage media whose forms are known in the art.

The embodiments described above are all exemplary in nature, rather than restrictive to the present invention. A person skilled in the art may conceive of various variations and modifications within principles of the present invention, and these variations and modifications shall fall within the scope of the present invention.

The invention claimed is:

1. A predistorter, comprising:
    a modulus value determining section, which determines a modulus value of an input signal;
    a base searching section, which searches a predetermined base lookup table in accordance with the modulus value of the input signal, so as to obtain a base lookup table value;
    an offset searching section, which searches a predetermined offset lookup table in accordance with the modulus value of the input signal, so as to obtain an offset lookup table value;
    an interpolation factor generating section, which generates an interpolation factor in accordance with the modulus value of the input signal;
    a multiplying section, which multiplies the offset lookup table value with the interpolation factor; and
    a summating section, which adds a product obtained by the multiplying section to the base lookup table value, so as to obtain a predistortion value.

2. The predistorter according to claim 1, wherein the base lookup table is a base amplitude lookup table, the base lookup table value is a base amplitude lookup table value, the offset lookup table is an offset amplitude lookup table, the offset lookup table value is an offset amplitude lookup table value, the interpolation factor is an amplitude interpolation factor, and the predistortion value is an amplitude predistortion value.

3. The predistorter according to claim 1, wherein the base lookup table is a base phase lookup table, the base lookup table value is a base phase lookup table value, the offset lookup table is an offset phase lookup table, the offset lookup table value is an offset phase lookup table value, the interpolation factor is a phase interpolation factor, and the predistortion value is a phase predistortion value.

4. The predistorter according to claim 1, wherein the base lookup table includes a base phase lookup table and a base amplitude lookup table, the base lookup table value includes a base phase lookup table value and a base amplitude lookup table value, the offset lookup table includes an offset phase lookup table and an offset amplitude lookup table, the offset lookup table value includes an offset phase lookup table value and an offset amplitude lookup table value, the interpolation factor includes a phase interpolation factor and an amplitude interpolation factor, the multiplying section multiplies the offset phase lookup table value with the phase interpolation factor, and multiplies the offset amplitude lookup table value with the amplitude interpolation factor, and the summating section adds the product of the offset phase lookup table value and the phase interpolation factor obtained by the multiplying section to the base phase lookup table value to obtain a phase predistortion value, and adds the product of the offset amplitude lookup table value and the amplitude interpolation factor obtained by the multiplying section to the base amplitude lookup table value to obtain an amplitude predistortion value.

5. The predistorter according to claim 1, wherein the interpolation factor generating section comprises:
a lookup table index value obtaining section, which obtains a lookup table index value;
a predistortion parameter storing section, which stores an essential interpolation factor and an essential lookup table index value corresponding thereto; and
an interpolation factor obtaining section, which obtains an interpolation factor value in accordance with the lookup table index value, the essential lookup table index value and the essential interpolation factor.

6. The predistorter according to claim 5, wherein the interpolation factor obtaining section makes use of piecewise linear interpolation or lagrange interpolation to obtain the interpolation factor value in accordance with the lookup table index value, the essential lookup table index value and the essential interpolation factor.

7. The predistorter according to claim 5, wherein the essential lookup table index value and the essential interpolation factor are parameters of the predistorter.

8. A predistortion system, comprising the predistorter according to claim 1.

9. The predistortion system according to claim 8, further comprising a power amplifier, an out-band power calculating unit, and a predistorter parameter updating unit, wherein the power amplifier amplifies a signal predistorted by the predistorter, the out-band power calculating unit determines an out-band power of the amplified signal fed back from the power amplifier, and the predistorter parameter updating unit updates a parameter of the predistorter in accordance with the out-band power.

10. A predistortion method, comprising:
determining a modulus value of an input signal;
searching a predetermined base lookup table in accordance with the modulus value of the input signal, so as to obtain a base lookup table value;
searching a predetermined offset lookup table in accordance with the modulus value of the input signal, so as to obtain an offset lookup table value;
generating an interpolation factor in accordance with the modulus value of the input signal;
multiplying the offset lookup table value with the interpolation factor; and
adding a product obtained by the multiplying to the base lookup table value, so as to obtain a predistortion value.

* * * * *